(12) United States Patent
Ramesh

(10) Patent No.: US 11,496,149 B2
(45) Date of Patent: *Nov. 8, 2022

(54) BIT STRING CONVERSION INVOKING BIT STRINGS HAVING A PARTICULAR DATA PATTERN

(71) Applicant: Micron Technology, Inc., Boise, ID (US)

(72) Inventor: Vijay S. Ramesh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/067,104

(22) Filed: Oct. 9, 2020

(65) Prior Publication Data

US 2021/0036712 A1 Feb. 4, 2021

Related U.S. Application Data

(63) Continuation of application No. 16/415,094, filed on May 17, 2019, now Pat. No. 10,833,700.

(Continued)

(51) Int. Cl.
*G06F 3/06* (2006.01)
*G06F 7/49* (2006.01)
*H03M 7/14* (2006.01)

(52) U.S. Cl.
CPC ............ *H03M 7/14* (2013.01); *G06F 3/0604* (2013.01); *G06F 3/0638* (2013.01); *G06F 3/0659* (2013.01); *G06F 3/0673* (2013.01)

(58) Field of Classification Search
CPC .... G06F 3/0673; G06F 3/0638; G06F 3/0659; G06F 3/0604; G06F 2212/7202;

(Continued)

(56) References Cited

U.S. PATENT DOCUMENTS 4,758,972 A 7/1988 Frazier
5,731,774 A * 3/1998 Fujii ..................... H03M 1/682
 341/144

(Continued)

FOREIGN PATENT DOCUMENTS

WO 0054218 A1 9/2000
WO WO-0054218 A1 * 9/2000 ............... G06T 3/40

OTHER PUBLICATIONS

"Beyond Floating Point—Next Generation Computer" by John L. Gustafson, Feb. 2, 2017 (Year: 2017).*

(Continued)

*Primary Examiner* — Ilwoo Park
(74) *Attorney, Agent, or Firm* — Brooks, Cameron & Huebsch, PLLC

(57) ABSTRACT

Systems, apparatuses, and methods related to bit string conversion are described. A memory resource and/or logic circuitry may be used in performance of bit string conversion operations. The logic circuitry can perform operations on bit strings, such as universal number and/or posit bit strings, to alter a level of precision (e.g., a dynamic range, resolution, etc.) of the bit strings. For instance, the memory resource can receive data comprising a bit string having a first quantity of bits that correspond to a first level of precision. The logic circuitry can determine that the bit string having the first quantity of bits has a particular data pattern and alter the first quantity of bits to a second quantity of bits that correspond to a second level of precision based, at least in part, on the determination that the bit string has the particular data pattern.

20 Claims, 5 Drawing Sheets

Related U.S. Application Data

(60) Provisional application No. 62/817,792, filed on Mar. 13, 2019.

(58) Field of Classification Search
CPC ............. G06F 12/04; G06F 2212/1044; G06F 12/0238; G06F 3/0661; G06F 3/0608; G06F 3/0679; G06F 7/48–49994; H03M 7/14; H03M 7/3059; H03M 7/3084; H03M 7/6047; H03M 9/00; H03M 7/02–24; G11C 16/10; G06N 3/063; G06N 3/08
USPC .................................. 708/204–205, 495–500
See application file for complete search history.

(56) References Cited

U.S. PATENT DOCUMENTS

| | | | |
|---|---|---|---|
| 7,865,541 | B1 | 1/2011 | Langhammer |
| 8,214,417 | B2 | 7/2012 | Ahmed |
| 2006/0106909 | A1* | 5/2006 | Howard .................. G06F 7/026 708/495 |
| 2007/0103352 | A1* | 5/2007 | Nakagawa ............ H03M 5/145 341/143 |
| 2007/0252738 | A1* | 11/2007 | Nakagawa ............ H03M 5/145 341/143 |
| 2012/0242848 | A1* | 9/2012 | Hirayama ............... H03M 7/24 348/208.6 |
| 2012/0324320 | A1* | 12/2012 | Terabe .................... G06F 11/10 714/807 |
| 2016/0062954 | A1* | 3/2016 | Ruff .......................... G06F 8/41 715/249 |
| 2016/0210120 | A1* | 7/2016 | Ozawa .................... G06F 7/483 |
| 2017/0010828 | A1* | 1/2017 | Rosen .................. G06F 3/0682 |
| 2017/0371545 | A1* | 12/2017 | Smithers ............... G06F 3/0626 |
| 2019/0171420 | A1* | 6/2019 | Malaya .................. G06N 3/063 |
| 2020/0050429 | A1* | 2/2020 | Li ......................... G06F 7/4812 |

OTHER PUBLICATIONS

Unum (number format)—https://en.wikipedia.org/wiki/Unum_(number_format) May 7, 2020 (Year: 2020).*

Gustafson, et al. "Beating Floating Point at its Own Game: Posit Arithmetic", Jan. 2017, retrieved from <http://www.johngustafson.net/pdfs/BeatingFloatingPoint.pdf>, 16 pages.

Gustafson, "Beyond Floating Point—Next Generation Computer", Feb. 2, 2017, 46 pages.

Unum (number format)—https://en.wikipedia.org/wiki/Unum_(number_format) May 7, 2020.

* cited by examiner

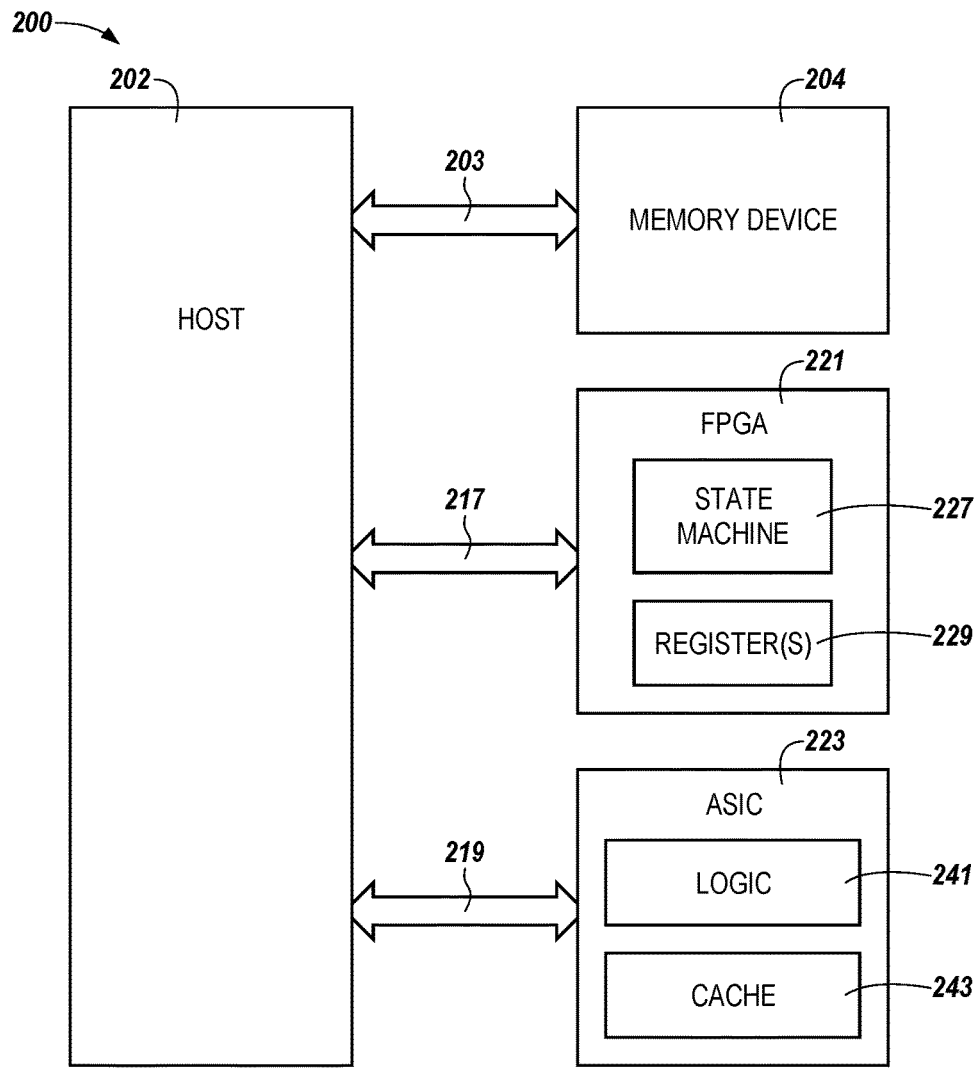
FIG. 2C
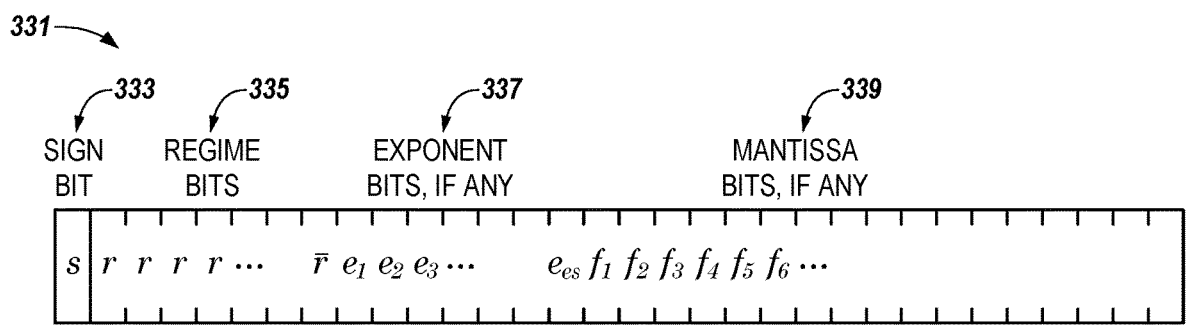
FIG. 3 *(PRIOR ART)*

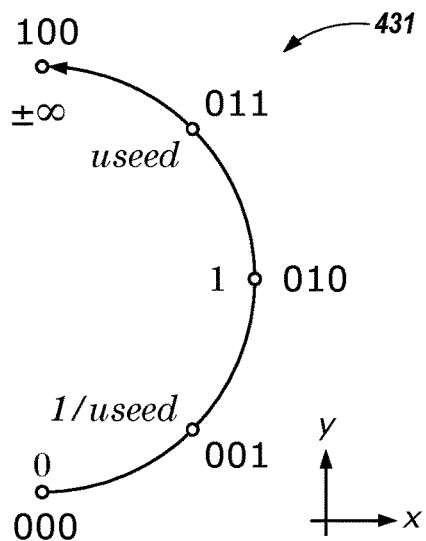
FIG. 4A *(PRIOR ART)*
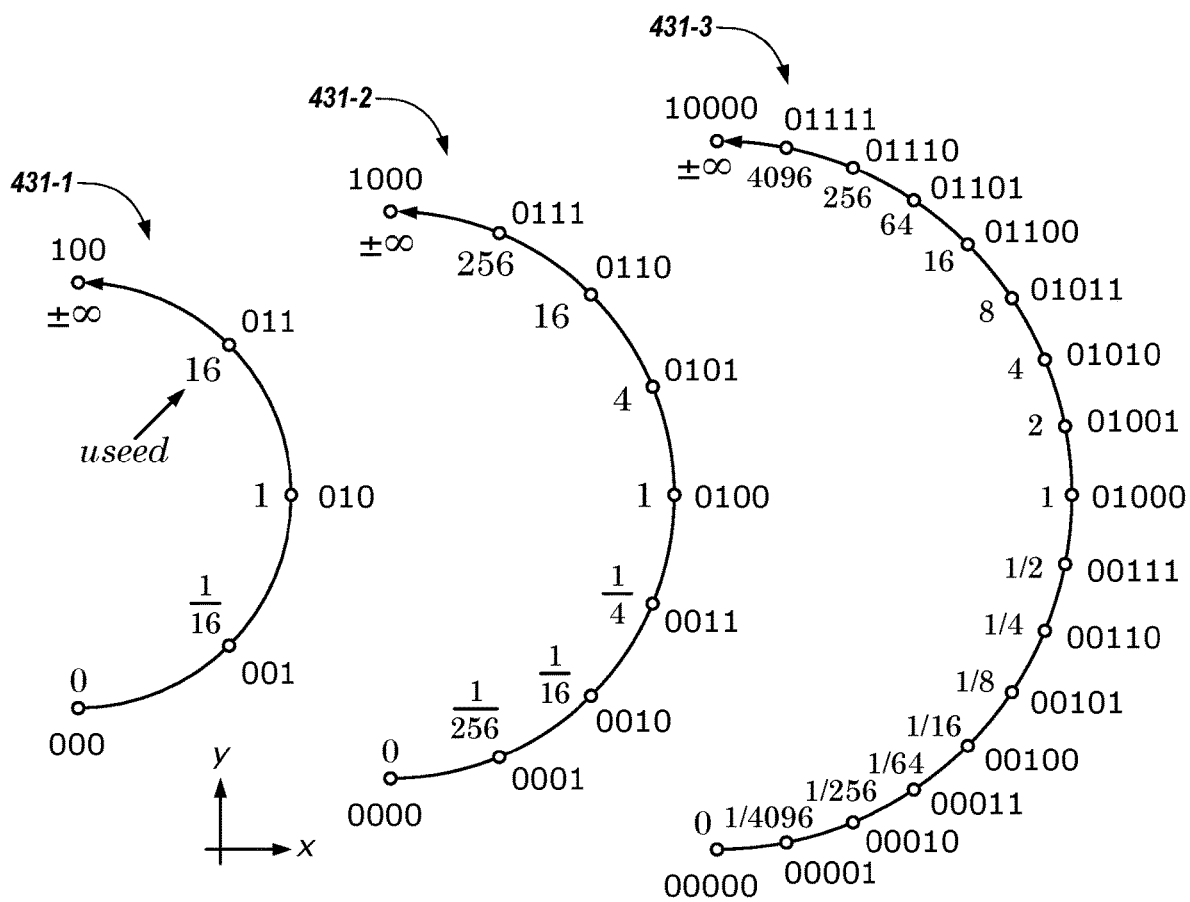
FIG. 4B *(PRIOR ART)*

BIT STRING CONVERSION INVOKING BIT STRINGS HAVING A PARTICULAR DATA PATTERN

PRIORITY INFORMATION

This application is a continuation of U.S. application Ser. No. 16/415,094, filed May 17, 2019, which issued on Nov. 10, 2020 as U.S. Pat. No. 10,833,700, and claims priority to U.S. Provisional application Ser. No. 62/817,792 filed on Mar. 13, 2019, the contents of which are incorporated herein by reference.

TECHNICAL FIELD

The present disclosure relates generally to semiconductor memory and methods, and more particularly, to apparatuses, systems, and methods for bit string conversion.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

BRIEF DESCRIPTION OF THE DRAWINGS

FIG. 2C is a functional block diagram in the form of a computing system including a host, a memory device, an application-specific integrated circuit, and a field programmable gate array in accordance with a number of embodiments of the present disclosure.

FIG. 3 is an example of an n-bit post with es exponent bits.

FIG. 4A is an example of positive values for a 3-bit posit.

FIG. 4B is an example of posit construction using two exponent bits.

DETAILED DESCRIPTION

Figure 1A:
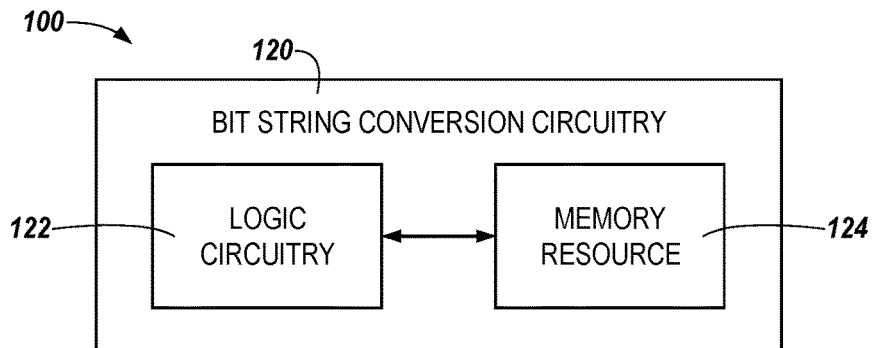
FIG. 1A is a functional block diagram in the form of an apparatus including logic circuitry and a memory resource in accordance with a number of embodiments of the present disclosure.

Systems, apparatuses, and methods related to bit string conversion are described. A memory resource and/or logic circuitry may be used in performance of bit string conversion operations. The logic circuitry can perform operations on bit strings, such as universal number and/or posit bit strings, to alter a level of precision (e.g., a dynamic range, resolution, etc.) of the bit strings. For instance, the memory resource can receive data comprising a bit string having a first quantity of bits that correspond to a first level of precision. The logic circuitry can determine that the bit string having the first quantity of bits has a particular data pattern and alter the first quantity of bits to a second quantity of bits that correspond to a second level of precision based, at least in part, on the determination that the bit string has the particular data pattern.

As used herein, a "data pattern" refers to a particular sequence of bits or arrangement of bits corresponding to a bit string that can be used to infer characteristics of the bit string. For example, is a bit string has a threshold quantity of repeating bits (e.g., the last bits of the bit string are all zero, the last bits of the bit string are non-zero, etc.), the bit string can be said to have a particular data pattern corresponding thereto. In a non-limiting example, a first bit string, 11010000 and a second bit string 10110000 may have the same data pattern because the last four bits of each of the bit strings are all zeros. In another non-limiting example, a first bit string 10111010111 and a second bit string 01011010111 may have the same bit pattern because the final three bits are all ones.

Computing systems may perform a wide range of operations that can include various calculations, which can require differing degrees of accuracy. However, computing systems have a finite amount of memory in which to store operands on which calculations are to be performed. In order to facilitate performance of operation on operands stored by a computing system within the constraints imposed by finite memory resources, operands can be stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the mantissa to indicate whether a real number is an exact float, or if it lies in the interval between adjacent floats. The sign, exponent, and mantissa bits in a Type I unum take their definition from the IEEE 754 floating-point format, however, the length of the exponent and mantissa fields of Type I unums can vary dramatically, from a single bit to a maximum user-definable length. By taking the sign, exponent, and mantissa bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, however, Type II unums can permit a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. As a result, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for higher precision (e.g., a broader dynamic range, higher resolution, and/or higher accuracy) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations thereby reducing processing time and/or power consumed in performing such operations. In addition, the use of posits in computing systems can allow for higher accuracy and/or precision in computations than floating-point numbers, which can further improve the functioning of a computing system in comparison to some approaches (e.g., approaches which rely upon floating-point format bit strings).

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

These features can, in some embodiments, allow for posits to be highly reconfigurable, which can provide improved application performance in comparison to approaches that rely on floats or other numerical formats. In addition, these features of posits can provide improved performance in machine learning applications in comparison to floats or other numerical formats. For example, posits can be used in machine learning applications, in which computational performance is paramount, to train a network (e.g., a neural network) with a same or greater accuracy and/or precision than floats or other numerical formats using fewer bits than floats or other numerical formats. In addition, inference operations in machine learning contexts can be achieved using posits with fewer bits (e.g., a smaller bit width) than floats or other numerical formats. By using fewer bits to achieve a same or enhanced outcome in comparison to floats or other numerical formats, the use of posits can therefore reduce an amount of time in performing operations and/or reduce the amount of memory space required in applications, which can improve the overall function of a computing system in which posits are employed.

Embodiments herein are directed to hardware circuitry (e.g., logic circuitry and/or a machine learning component) configured to perform various operations on bit strings to improve the overall functioning of a computing device. For example, embodiments herein are directed to hardware circuitry that is configured to perform operations to alter a numerical value and/or a quantity of bits of a bit string to vary a level of precision of the bit string. For example, embodiments herein can allow for numerical values and/or the quantity of bits associated with respective bit sub-sets of a bit string to be altered to vary a level of precision of the bit string. By varying a numerical value and/or a quantity of bits of various sub-sets of bits in a bit string, the precision of the bit string and, hence, the precision of a result of arithmetic and/or logical operations performed using the bit string may be controlled.

In some embodiments, the hardware circuitry can cause the numerical values and/or the quantity of bits associated with a bit string to be varied based on a determination that the bit string exhibits a particular data pattern. For example, the hardware circuitry can monitor bit strings and determine if any of the bit strings have similar data patterns. In response to detecting one or more bit strings that have a same data pattern, the hardware circuitry can vary the precision of the bit string by altering a numerical value and/or a quantity of bits associated with one or more bit sub-sets of the bit string.

Varying the precision of bit strings used in performance of arithmetic and/or logical operations can facilitate improved performance of the computing system by allowing for improved precision and/or accuracy in performed arithmetic and/or logical operations in applications where precision and/or accuracy are desirable. Conversely, in applications where precision and/or accuracy are of less importance, varying the precision of bit strings used in performance of arithmetic and/or logical operations can facilitate improved performance of the computing system by improving speed in performing the operations (e.g., bit strings having a smaller bit width can require fewer clock cycles in performance of arithmetic and/or logical operations) and/or a reduced required storage space for bit strings during performance of arithmetic and/or logical operations.

In some approaches, the precision of the bit string may not be varied, which can lead to heightened power consumption and/or relatively long processing times. For example, hardware circuitry such as an arithmetic logic unit may be used in conjunction with a field programmable gate array (FPGA) to perform operations using bit strings. However, the FPGA may create a processing bottleneck under certain conditions. This can be further exacerbated by the bit length of quire register operations, which can, in some approaches vary between 64 bits and around 4096 bits. In order to remedy these and other issues that can arise under some circumstances, embodiments herein can allow for the precision of bit strings to be dynamically varied based on the application the bit strings are used for, a desired power consumption level, a desired processing time, or other parameters.

For example, if an application is running 32-bit posit bit strings with an exponent bit sub-set value of 4 (e.g., a (32,4) posit bit string), embodiments herein can allow for the precision (e.g., the dynamic range) of the posit bit string to be halved to a (16,2) posit bit string. By "down-converting" a (32,4) posit bit string to a (16,2) bit string, the size of a corresponding quire register may also be reduced from, for example, 2048 bits to 512 bits.

Similarly, if an application is running lower order bit width and/or precision posit bit strings (e.g., (8,0) or (16,2) posit bit strings), and a higher precision is desired, an operation to "up-convert" the posit bit strings can be performed to increase the precision and/or exponent bit sub-set. For example, an (8,0) posit bit string can be "up-converted" to a (16,2) posit bit string, a (16,2) posit bit string can be "up-converted" to a (32,4) posit bit string, etc. Whether to "up-convert" or "down-convert" the posit bit strings can be application dependent, as described in more detail, herein.

In some embodiments, a machine learning component can be a piece of hardware (e.g., a state machine, ALU, FPGA, reduced instruction set computing architecture, etc.) that may have access to one or more counters. The machine learning component can be provided access to computational registers for bit strings that are being processed (e.g., bit strings with which operations are performed).

In an example, the machine learning component can determine that the values of the mantissa and/or the exponent bit sub-sets are mostly zero for operations performed using the bit strings and can cause the counter to be incremented in response to detection of each bit string that has greater than a threshold quantity of zeros in the exponent and/or mantissa bit sub-sets. Once a threshold counter value has been reached (e.g., 10, 20, 100, etc.), the machine learning component can cause the precision of the bit strings to be down-converted to a lesser bit width. For example, if the operations are using (32,4) posit bit strings and the counter has been incremented to the threshold value, the machine learning component can cause the posit bit strings to be converted to (16,2) posit bit strings. This may save processing resources and/or time without sacrificing much, if any, accuracy since most of the bit strings being processed had mostly zeros in the mantissa and/or exponent bit sub-sets.

In some embodiments, if the exponent bit sub-sets include an odd number (e.g., a (32,3) posit bit string), a choice may be given as to what exponent bit sub-set value to use when performing the "down-convert." For example, the machine learning component may cause a choice to be presented in which a user is asked to use an exponent bit sub-set value of zero or one, for example. Embodiments are not so limited, however, and the machine learning component may, in some embodiments, automatically determine what exponent bit sub-set value to use based on information the machine learning component has acquired while monitoring the bit strings. The machine learning component can, in some embodiments, ensure that the value of the exponent bit sub-set never goes below zero.

In some embodiments, the machine learning component can be trained over time to perform operations to vary the precision of posit bit strings in the absence of external input. For example, in some embodiments, the counter can be eliminated, and the machine learning component can perform operations to vary the precision (e.g., "up-convert" and/or "down-convert" operations) based on past behavior of the bit strings and/or data patterns associated with the bit strings.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context. In addition, the terms "set of bits," "bit sub-set," and "portion" (in the context of a portion of bits of a bit string) are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 433-1, 433-2, . . . , 433-N may be referred to generally as 433. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of an apparatus 100 including bit string conversion circuitry 120 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. As shown in FIG. 1, the apparatus 100 can include bit string conversion circuitry 120, which can include logic circuitry 122 and a memory resource 124.

The memory resource 124 can include volatile memory resource, non-volatile memory resources, or a combination of volatile and non-volatile memory resources. In some embodiments, the memory resource can be a random-access memory (RAM) such as static random-access memory (SRAM).

Embodiments are not so limited, however, and the memory resource can be a cache, one or more registers, NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

The memory resource 124 can store one or more bit strings. In some embodiments, the bit string(s) stored by the memory resource 124 can be stored according to a universal number (unum) or posit format. As used herein, the bit string stored in the unum (e.g., a Type III unum) or posit format can include several sub-sets of bits or "bit sub-sets." For example, a universal number or posit bit string can include a bit sub-set referred to as a "sign" or "sign portion," a bit sub-set referred to as a "regime" or "regime portion," a bit sub-set referred to as an "exponent" or "exponent portion," and a bit-subset referred to as a "mantissa" or "mantissa portion" (or significand). As used herein, a bit sub-set is intended to refer to a sub-set of bits included in a bit string. Examples of the sign, regime, exponent, and mantissa sets of bits are described in more detail in connection with FIGS. 3 and 4A-4B, herein. Embodiments are not so limited, however, and the memory resource can store bit strings in other formats, such as the floating-point format, or other suitable formats.

The logic circuitry 122, which is coupled to the memory resource 124, can be provided in the form of one or more processors (e.g., a processing device or processing unit), an integrated circuit, such as an application-specific integrated circuit (ASIC), field programmable gate array (FPGA), reduced instruction set computing device (RISC), system-on-a-chip, or other combination of hardware and/or circuitry that is configured to perform operations described in more detail, herein. For example, the logic circuitry 122 can be configured to alter a numerical value or a quantity of bits of a bit string stored by the memory resource 124 to vary a level of precision associated with the bit string. Varying the level of precision of the bit string can include adding and/or removing bits from the bit string to alter a dynamic range associated with the bit string, a resolution of the bit string, or other properties of the bit string that correspond to a level of precision or accuracy associated with the bit string.

In some embodiments, the memory resource 124 can be configured to receive data comprising a bit string that has a first quantity of bits that correspond to a first level of precision. The logic circuitry 122 can be configured to alter the first quantity of bits to a second quantity of bits that correspond to a second level of precision. In some embodiments, the first level of precision or the second level of precision can be greater than the other of the first level of precision or the second level of precision. For example, the first level of precision may be greater than the second level of precision, and vice versa.

In a non-limiting example, the first level of precision may correspond to a bit string with a bit width of 32-bits and the second level of precision may correspond to a bit string with a bit width of 16-bits. Similarly, in another non-limiting example, the first level of precision may correspond to a bit string with a bit width of 8-bits and the second level of precision may correspond to a bit string with a bit width of 16-bits. Examples are not limited to these specific levels of precision and the first level of precision and/or the second level of precision can correspond to bit strings with bit widths of 8-bits, 16-bits, 32-bits, 64-bits, etc.

In some embodiments, the logic circuitry 122 can cause one or more bits to be added to, or removed from, at least one bit sub-set of the bit string to alter the quantity of bits of the bit string from the first quantity of bits to the second quantity of bits. For example, the logic circuitry 122 can cause one or more bits to be added to the bit sub-set corresponding to the sign, the bit sub-set corresponding to the regime, bit sub-set corresponding to the exponent, and/or the bit sub-set corresponding to the mantissa of the bit string, as described in more detail in connection with FIGS. 2A-2C, 3, 4A-4B, and 5, herein.

The logic circuitry 122 can also be configured to determine a maximum positive (e.g., maxpos described in connection with FIGS. 4A and 4B) value for the bit string having the second quantity of bits and/or determine a minimum positive (e.g., minpos described in connection with FIGS. 4A and 4B) value for the bit string having the second quantity of bits. The logic circuitry 122 can then alter the second quantity of bits to a third quantity of bits that correspond to the maximum positive value for the bit string or the minimum positive value for the bit string. For example, after the logic circuitry 122 has altered the quantity of bits of the bit string, it may be necessary to clip the bit width of the resultant bit string to the minimum positive value associated with the bit string to avoid converting a bit string with a small numerical value or a small number of bits to zero. Similarly, it may be necessary to cap the bit width of the resultant bit string at the maximum positive value associated with the bit string to avoid a scenario in which the bit width of the bit string becomes too large.

Figure 1B:
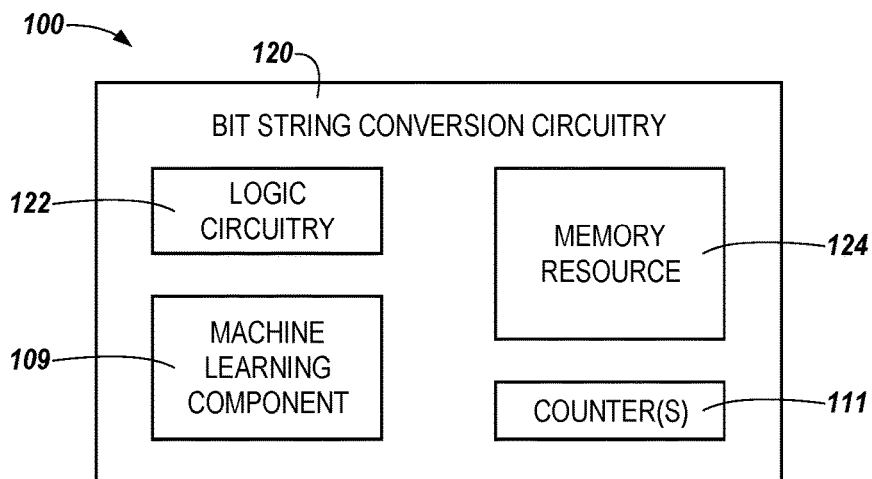
FIG. 1B is another functional block diagram in the form of an apparatus including logic circuitry and a memory resource in accordance with a number of embodiments of the present disclosure.

FIG. 1B is another functional block diagram in the form of an apparatus 100 including logic circuitry 122 and a memory resource 124 in accordance with a number of embodiments of the present disclosure. The bit string conversion circuitry 120 can further include a machine learning component 109 and/or a counter(s) 111. In some embodiments, the machine learning component 109 and/or the counter(s) can be provided as part of the logic circuitry 122, however, embodiments are not so limited, and the machine learning component 109 and/or the counter(s) 111 can be physically distinct from, but coupled to, the logic circuitry 122 and/or the memory resource 124.

In some embodiments, the machine learning component 109 can monitor characteristics of operations that are performed using bit string, such as posit bit strings. For example, the machine learning component 109 can "snoop" registers (e.g., locations in the memory resource 124) in which posit bit strings that are used as operands in the performance of various arithmetic and/or logical operations are stored. The machine learning component 109 can learn data patterns associated with the bit strings and can determine whether to initiate an operation to vary the precision of the bit strings by altering a numerical value or a quantity of bits associated with one or more bit sub-sets of the bit strings.

For example, if the machine learning component 109 determines that bit strings being stored by, or operated upon by, the bit string conversion circuitry 120 have a threshold quantity of bits that are not relevant to the arithmetic operations and/or logical operations for which the bit string is used, the machine learning component 109 can cause an operation to vary the precision of the bit string to be performed. In this example, the machine learning component 109 may determine that a threshold quantity of bits of the bit string are zeros and can cause the bit string to be converted to a bit string with a lower bit width. This can reduce storage space, power consumption, and/or an amount of time in performing operations using bit strings, because the machine learning component 109 can cause the bit width of the bit string to be reduced, thereby reducing the quantity of irrelevant bits in the bit string.

In another example, the machine learning component 109 may determine that the bit string has a bit width that is too narrow to effectively perform arithmetic and/or logical operations and may vary the precision of the bit string to increase the numerical value and/or quantity of bits of one or more bit sub-sets of the bit string. For example, the machine learning component 109 can convert the bit string from an 8-bit sit string to a 16-bit bit string, a 16-bit bit string to a 32-bit bit string, etc. in response to determining that a higher precision for the bit string may be appropriate. This can provide improved accuracy in operations using the bit string.

In some embodiments, the counter(s) 111 can be incremented and/or decremented in response to detection of various characteristics of bit strings being stored by, or operated upon by, the bit string conversion circuitry 120. For example, in response to a bit string having a particular data pattern associated therewith, the counter(s) 111 may be incremented or decremented. In response to the counter being incremented to a particular value (e.g., a particular threshold value), the logic circuitry 122 and/or the machine learning component 109 may take an action to vary the precision of one or more subsequent bit strings that exhibit the same or a similar data pattern. For example, if a threshold quantity of bits at the end of the bit string are all zeros, the logic circuitry 122 and/or the machine learning component 109 can cause the bit string to be converted (e.g., "down-converted") to a bit string that has a shorter bit width. Conversely, if a threshold quantity of bits at the end of the bit string are all non-zero, the logic circuitry 122 and/or the machine learning component 109 can cause the bit string to be converted (e.g., "up-converted") to a bit string that has a longer bit width As used herein, a "data pattern" refers to a particular sequence of bits or arrangement of bits corresponding to a bit string that can be used to infer characteristics of the bit string. For example, is a bit string has a threshold quantity of repeating bits (e.g., the last bits of the bit string are all zero, the last bits of the bit string are non-zero, etc.), the bit string can be said to have a particular data pattern corresponding thereto.

In some embodiments, the machine learning component 109 can determine whether or not to vary the precision of a bit string based on one or more criteria. An example of such a criterion is in the case of performing operations using bit strings when a low power and high bandwidth consumption is desired. In this example, it may be desirable to trade precision and accuracy for low power consumption. For example, in some machine learning applications, precision and accuracy may be less desirable than providing low power consumption and high bandwidth. Accordingly, in such applications, the machine learning component 109 may cause the precision of bit strings used in the application to be converted to have a shorter bit width (e.g., a "down-convert"), which may, in turn allow for low power, high bandwidth operations to be performed using the bit string.

In another example, an application may run in a power saving mode in which as few bits as possible are used in performance of operations. In this example, it may be desirable to minimize the power used in performing operations due to the constraints imposed by the power saving mode. Accordingly, in such applications, the machine learning component 109 may cause the precision of bit strings used in the application to be converted to have a shorter bit width (e.g., a "down-convert"), which may, in turn allow for operations to be performed using bit strings within the constraints imposed by the power saving mode. In this example, the machine learning component 109 may detect data patterns of the bit strings stored in the memory resource 124 (e.g., in a register or other storage location), and vary the precision of the bit strings to reduce the bit width of the bit strings based on the determination and/or the amount of power available to perform operations in the power saving mode.

Once it is determined that the operations can be performed using bit strings having a larger bit width, the machine learning component 109 can cause the precision of the bit strings to be varied by converting the bit strings (e.g., an "up-convert") to bit strings having a larger bit width. For example, if it is determined that the power saving mode has been exited or if low power and high bandwidth consumption is no longer desired, the machine learning component 109 and/or the logic circuitry 122 can vary the precision of the bit strings to increase the bit width of the bit string. In some embodiments, the precision of the bit strings can be varied in response to a determination that one or more registers used by the bit strings are overflowing. This may allow for higher precision and/or accuracy to be achieved in operations using the bit string.

In some embodiments, the memory resource 124 can be configured to receive data comprising a bit string having a first quantity of bits that correspond to a first level of precision. The logic circuitry 122 and/or the machine learning component 109 can be configured to determine that the bit string having the first quantity of bits has a particular data pattern associated therewith and/or alter the first quantity of bits to a second quantity of bits that correspond to a second level of precision based, at least in part, on the determination that the bit string has the particular data pattern associated therewith. In some embodiments, the logic circuitry 122 and/or the machine learning component 109 can be configured to determine that one or more bit sub-sets of the bit string having the first quantity of bits have a threshold quantity of bits having a particular value as part of determining that the bit string has the particular data pattern.

The counter 111 can be configured to increment in response to the determination that the bit string has the particular data pattern associated therewith. The logic circuitry 122 can be configured to determine that the counter has been incremented to a threshold value and/or alter the first quantity of bits to the second quantity of bits based on the determination that the counter has been incremented to the threshold value.

Figure 2A:
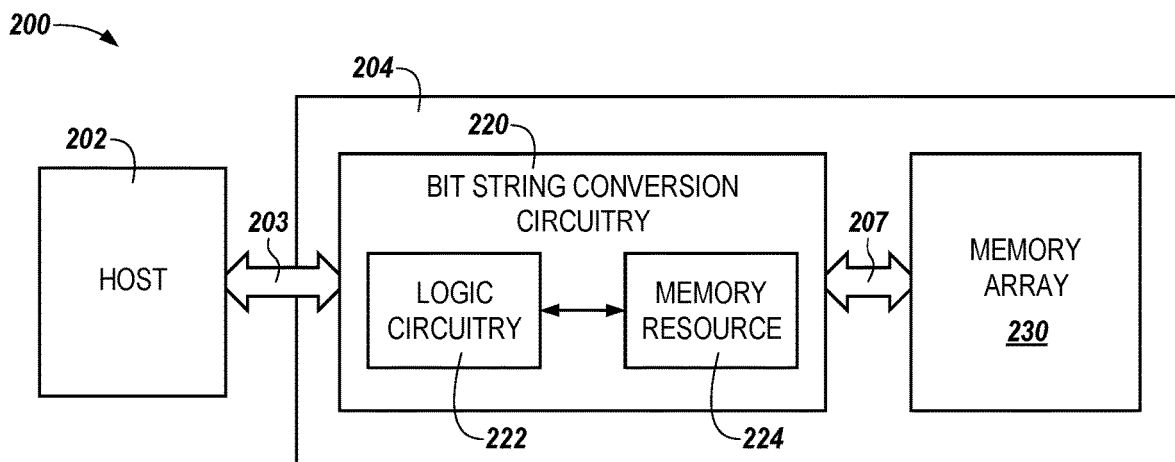
FIG. 2A is a functional block diagram in the form of a computing system including an apparatus including a host and a memory device in accordance with a number of embodiments of the present disclosure.

FIG. 2A is a functional block diagram in the form of a computing system 200 including an apparatus including a host 202 and a memory device 204 in accordance with a number of embodiments of the present disclosure. The memory device 204 can include a one or more memory modules (e.g., single in-line memory modules, dual in-line memory modules, etc.). The memory device 204 can include volatile memory and/or non-volatile memory. In a number of embodiments, memory device 204 can include a multi-chip device. A multi-chip device can include a number of different memory types and/or memory modules. For example, a memory system can include non-volatile or volatile memory on any type of a module. In addition, each of the components (e.g., the host 202, the bit string conversion circuitry 220, the logic circuitry 222, the memory resource 224, and/or the memory array 230) can be separately referred to herein as an "apparatus."

The memory device 204 can provide main memory for the computing system 200 or could be used as additional memory or storage throughout the computing system 200. The memory device 204 can include one or more memory arrays 230 (e.g., arrays of memory cells), which can include volatile and/or non-volatile memory cells. The memory array 230 can be a flash array with a NAND architecture, for example. Embodiments are not limited to a particular type of memory device. For instance, the memory device 204 can include RAM, ROM, DRAM, SDRAM, PCRAM, RRAM, and flash memory, among others.

In embodiments in which the memory device 204 includes non-volatile memory, the memory device 204 can include flash memory devices such as NAND or NOR flash memory devices. Embodiments are not so limited, however, and the memory device 204 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof.

As illustrated in FIG. 2A, a host 202 can be coupled to the memory device 204. In a number of embodiments, the memory device 204 can be coupled to the host 202 via one or more channels (e.g., channel 203). In FIG. 2A, the memory device 204 is coupled to the host 202 via channel 203 and bit string conversion circuitry 220 of the memory device 204 is coupled to the memory array 230 via a channel 207. The host 202 can be a host system such as a personal laptop computer, a desktop computer, a digital camera, a smart phone, a memory card reader, and/or internet-of-things enabled device, among various other types of hosts, and can include a memory access device, e.g., a processor (or processing device). One of ordinary skill in the art will appreciate that "a processor" can intend one or more processors, such as a parallel processing system, a number of coprocessors, etc.

The host 202 can include a system motherboard and/or backplane and can include a number of processing resources (e.g., one or more processors, microprocessors, or some other type of controlling circuitry). The system 200 can include separate integrated circuits or both the host 202, the memory device 204, and the memory array 230 can be on the same integrated circuit. The system 200 can be, for instance, a server system and/or a high-performance computing (HPC) system and/or a portion thereof. Although the example shown in FIG. 2A illustrates a system having a Von Neumann architecture, embodiments of the present disclosure can be implemented in non-Von Neumann architectures, which may not include one or more components (e.g., CPU, ALU, etc.) often associated with a Von Neumann architecture.

The logic circuitry 222 can include one or more processors (e.g., processing units) and/or an arithmetic logic unit (ALU). In embodiments in which the logic circuitry 222 comprises and ALU, the ALU can include circuitry (e.g., hardware, logic, one or more processing devices, etc.) to perform operations (e.g., operations to vary the precision of a bit string, etc.) such as the operations described above, on integer binary bit strings, such as bit strings in the posit format. Embodiments are not limited to an ALU, however, and in some embodiments, the logic circuitry 222 can include a state machine and/or an instruction set architecture (or combinations thereof) in addition to, or in lieu of the ALU, as described in more detail in connection with FIGS. 2C and 5, herein.

The bit string conversion circuitry 220 can further include a memory resource 224, which can be communicatively coupled to the logic circuitry 222. In some embodiments, the memory resource 224 can receive a first bit string having a first quantity of bits that correspond to a first level of precision. In some embodiments, the bit string can have four sets of bits (e.g., bit sub-sets) associated therewith. For example, the bit string can include a sign portion, a regime portion, an exponent portion, and a mantissa portion. That is, in some embodiments, the bit string can be a unum bit string, such as a posit bit string.

The logic circuitry 222 can perform an operation to alter the first quantity of bits of the first bit string to generate a second bit string having a second quantity of bits that correspond to a second level of precision. In some embodiments, the logic circuitry 222 can be controlled to perform the operation by a controller, such as the controller 210 illustrated in FIG. 2B. The first level of precision and the second level of precision can correspond to a dynamic range of the bit string, a resolution of the bit string, or both.

The operation to alter the first quantity of bits of the first bit string to generate the second bit string can include increasing or decreasing the quantity of bits of the mantissa portion in response to a determination that the quantity of bits of the exponent portion remain unchanged. For example, if the numerical value or the quantity of bits associated with the exponent bit sub-set is not changed as part of the operation, the logic circuitry 222 can increase or decrease the numerical value or the quantity of bits associated with the mantissa bit sub-set.

In some embodiments, the operation to alter the first quantity of bits of the first bit string to generate the second bit string can include increasing or decreasing the quantity of bits of the regime portion, the exponent portion, and the mantissa portion in response to a determination that the quantity of bits of the exponent portion are increased or decreased. For example, the logic circuitry 222 can be configured to increase or decrease the numerical value or the quantity of bits of the regime portion, the exponent portion, and the mantissa portion in response to a determination that the numerical value or the quantity of bits of the exponent portion are increased or decreased. In this example, if the numerical value or the quantity of bits associated with the exponent bit sub-set of the bit string is increased or decreased, the logic circuitry 222 can increase or decrease the numerical value or the quantity of bits associated with the regime bit sub-set, the exponent bit sub-set, and/or the mantissa bit sub-set.

The operation to alter the first quantity of bits of the first bit string to generate the second bit string can include increasing the quantity of bits of the exponent portion or the regime portion and decreasing the quantity of bits of the other of the exponent portion or the regime portion in response to a determination that the quantity of bits of the exponent portion are increased or decreased. For example, the logic circuitry can be configured to increase the numerical value or the quantity of bits of the exponent portion or the regime portion and decrease the numerical value or the quantity of bits of the other of the exponent portion or the regime portion in response to a determination that the quantity of bits of the exponent portion are increased or decreased. In this example, if the numerical value or quantity of bits associated with the exponent bit sub-set is increased, the numerical value or the quantity of bits associated with the regime bit sub-set can be decreased. Conversely, if the numerical value or quantity of bits associated with the exponent bit sub-set is decreased, the numerical value or the quantity of bits associated with the regime bit sub-set can be increased.

In some embodiments, the operation to alter the first quantity of bits of the first bit string to generate the second bit string can include altering a numerical value corresponding to the exponent portion. For example, the logic circuitry 222 can be configured to alter the numerical value of the exponent bit sub-set without altering a total bit width of the bit string. In a non-limiting example where the bit string has a bit width of 16-bits and an exponent bit sub-set value of zero (e.g., a bit string represented as (16,0), where the 16 corresponds to the bit width of the bit string and the zero corresponds to the numerical value or quantity of exponent bits included in the exponent bit sub-set), the logic circuitry 222 can be configured to alter the numerical value of the exponent bit sub-set to, for example, a bit string that is represented as a (16,1), (16,2), (16,3), etc. bit string.

The logic circuitry 222 can also be configured to determine a maximum positive (e.g., maxpos described in connection with FIGS. 4A and 4B) value for the bit string having the second quantity of bits and/or determine a minimum positive (e.g., minpos described in connection with FIGS. 4A and 4B) value for the bit string having the second quantity of bits. The logic circuitry 222 can then alter the second quantity of bits to generate a third bit string having a third quantity of bits that correspond to the maximum positive value for the bit string or the minimum positive value for the bit string. For example, after the logic circuitry 222 has altered the quantity of bits of the bit string, it may be necessary to clip the bit width of the resultant bit string to the minimum positive value associated with the bit string to avoid converting a bit string with a small numerical value or a small number of bits to zero. Similarly, it may be necessary to cap the bit width of the resultant bit string at the maximum positive value associated with the bit string to avoid a scenario in which the bit width of the bit string becomes too large.

As shown in FIG. 2A, the logic circuitry 222 and the memory resource 224 are included in a memory device 204 and the memory device 204 is coupled to the host 202. The memory device 204 can receive the data in a first format (e.g., in a floating-point format) from the host and/or convert the data to a second format (e.g., a unum or posit format). Subsequent to conversion of the data form the first format to the second format, an operation using the bit string having the second format can be performed. As described above, the operation can be an operation to vary a numerical value or a quantity of bits associated with the bit string to alter a level of precision associated with the bit string. In some embodiments, the memory device 204 can perform the operation and transfer a resultant bit string to the host 202 without receipt of an intervening command from the host 202. That is, in some embodiments, the bit string conversion circuitry 220 can perform the operation to vary a numerical vale or a quantity of bits associated with the bit string to alter a level of precision associated with the bit string and/or transfer the resultant bit string in response to receipt of the bit string without additional input from (e.g., without encumbering) the host 202.

The bit string conversion circuitry 220 can be communicatively coupled to the memory array 230 via one or more channels 207. The memory array 230 can be a DRAM array, SRAM array, STT RAM array, PCRAM array, TRAM array, RRAM array, NAND flash array, and/or NOR flash array, for instance. The array 230 can comprise memory cells arranged in rows coupled by access lines, which may be referred to herein as word lines or select lines, and columns coupled by sense lines, which may be referred to herein as data lines or digit lines. Although a single array 230 is shown in FIG. 2A, embodiments are not so limited. For instance, memory device 204 a number of memory arrays 230 (e.g., a number of banks of DRAM cells, NAND flash cells, etc.).

The embodiment of FIG. 2A can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 204 and/or the memory array 230. It will be appreciated by those skilled in the art that the number of address input connections can depend on the density and architecture of the memory device 204 and/or the memory array 230.

Figure 2B:
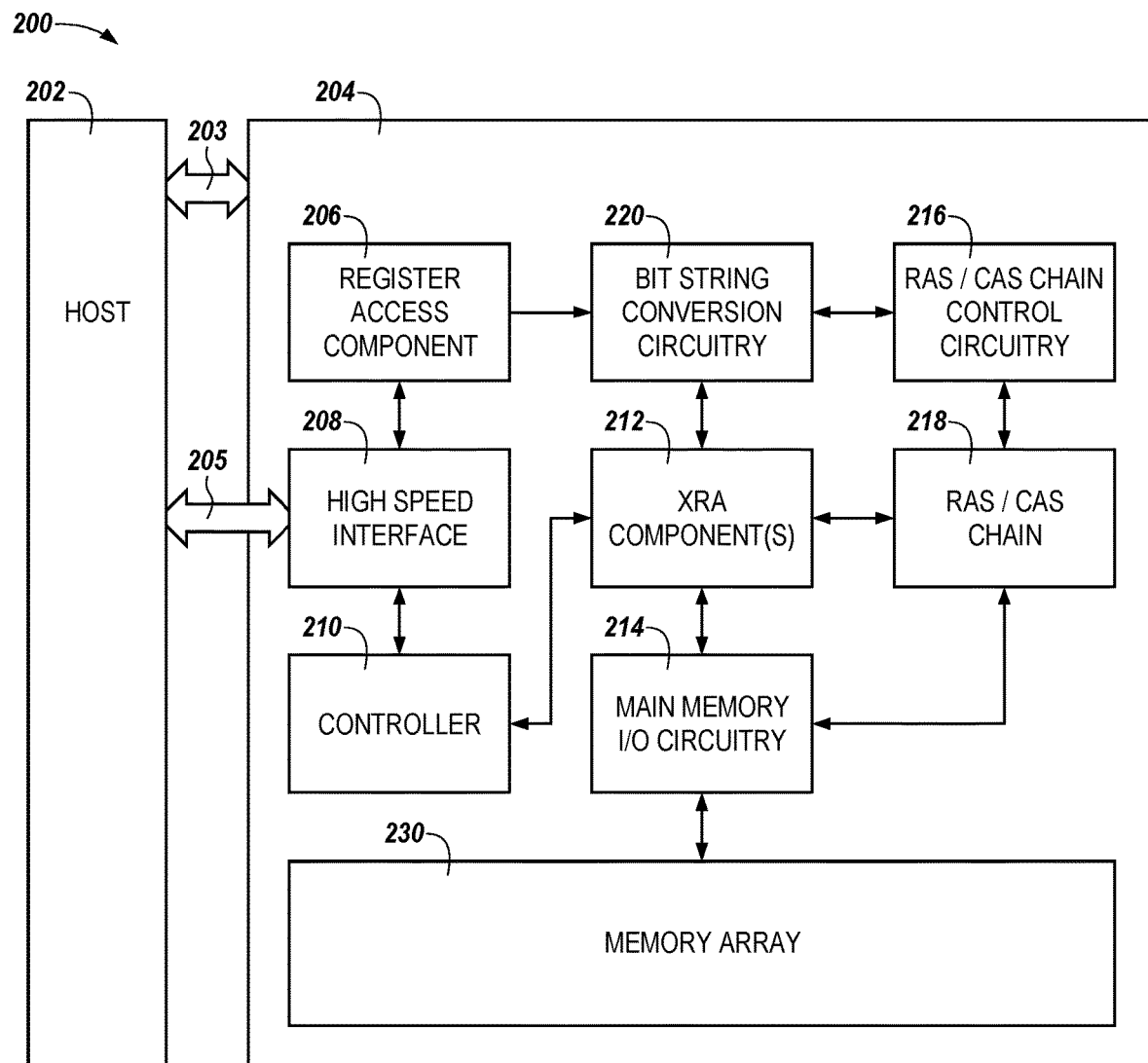
FIG. 2B is another functional block diagram in the form of a computing system including an apparatus including a host and a memory device in accordance with a number of embodiments of the present disclosure.

FIG. 2B is another functional block diagram in the form of a computing system including an apparatus 200 including a host 202 and a memory device 204 in accordance with a number of embodiments of the present disclosure. The memory device 204 can include bit string conversion circuitry 220, which can be analogous to the bit string conversion circuitry 220 illustrated in FIG. 2A. Similarly, the host 202 can be analogous to the host 202 illustrated in FIG. 2A, and the memory device 204 can be analogous to the memory device 204 illustrated in FIG. 2A. Each of the components (e.g., the host 202, the bit string conversion circuitry 220, the logic circuitry 222, the memory resource 224, and/or the memory array 230, etc.) can be separately referred to herein as an "apparatus."

The host 202 can be communicatively coupled to the memory device 204 via one or more channels 203, 205. The channels 203, 205 can be interfaces or other physical connections that allow for data and/or commands to be transferred between the host 202 and the memory device 204. For example, commands to cause initiation of an operation (e.g., an operation to vary the precision of bit string(s) by altering numerical values and/or a quantity of bits of respective bit sub-sets of the bit string) to be performed by the bit string conversion circuitry 220 can be transferred from the host via the channels 203, 205. It is noted that, in some examples, the bit string conversion circuitry 220 can perform the operations in response to an initiation command transferred from the host 202 via one or more of the channels 203, 205 in the absence of an intervening command from the host 202. That is, once the bit string conversion circuitry 220 has received the command to initiate performance of an operation from the host 202, the operations can be performed by the bit string conversion circuitry 220 in the absence of additional commands from the host 202.

As shown in FIG. 2B, the memory device 204 can include a register access component 206, a high speed interface (HSI) 208, a controller 210, one or more extended row address (XRA) component(s) 212, main memory input/output (I/O) circuitry 214, row address strobe (RAS)/column address strobe (CAS) chain control circuitry 216, a RAS/CAS chain component 218, bit string conversion circuitry 220, and a memory array 230. The bit string conversion circuitry 220 is, as shown in FIG. 2, located in an area of the memory device 204 that is physically distinct from the memory array 230. That is, in some embodiments, the bit string conversion circuitry 220 is located in a periphery location of the memory array 230.

The register access component 206 can facilitate transferring and fetching of data from the host 202 to the memory device 204 and from the memory device 204 to the host 202. For example, the register access component 206 can store addresses (or facilitate lookup of addresses), such as memory addresses, that correspond to data that is to be transferred to the host 202 from the memory device 204 or transferred from the host 202 to the memory device 204. In some embodiments, the register access component 206 can facilitate transferring and fetching data that is to be operated upon by the bit string conversion circuitry 220 and/or the register access component 206 can facilitate transferring and fetching data that is has been operated upon by the bit string conversion circuitry 220 for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)) interface, or other suitable interface for transferring commands and/or data between the host 202 and the memory device 204.

The controller 210 can be responsible for executing instructions from the host 202 and accessing the bit string conversion circuitry 220 and/or the memory array 230. The controller 210 can be a state machine, a sequencer, or some other type of controller. The controller 210 can receive commands from the host 202 (via the HSI 208, for example) and, based on the received commands, control operation of the bit string conversion circuitry 220 and/or the memory array 230. In some embodiments, the controller 210 can receive a command from the host 202 to cause performance of an operation using the bit string conversion circuitry 220. Responsive to receipt of such a command, the controller 210 can instruct the bit string conversion circuitry 220 to begin performance of the operation(s).

In some embodiments, the controller 210 can be a global processing controller and may provide power management functions to the memory device 204. Power management functions can include control over power consumed by the memory device 204 and/or the memory array 230. For example, the controller 210 can control power provided to various banks of the memory array 230 to control which banks of the memory array 230 are operational at different times during operation of the memory device 204. This can include shutting certain banks of the memory array 230 down while providing power to other banks of the memory array 230 to optimize power consumption of the memory device 230. In some embodiments, the controller 210 controlling power consumption of the memory device 204 can include controlling power to various cores of the memory device 204 and/or to the bit string conversion circuitry 220, the memory array 230, etc.

The XRA component(s) 212 are intended to provide additional functionalities (e.g., peripheral amplifiers) that sense (e.g., read, store, cache) data values of memory cells in the memory array 230 and that are distinct from the memory array 230. The XRA components 212 can include latches and/or registers. For example, additional latches can be included in the XRA component 212. The latches of the XRA component 212 can be located on a periphery of the memory array 230 (e.g., on a periphery of one or more banks of memory cells) of the memory device 204.

The main memory input/output (I/O) circuitry 214 can facilitate transfer of data and/or commands to and from the memory array 230. For example, the main memory I/O circuitry 214 can facilitate transfer of bit strings, data, and/or commands from the host 202 and/or the bit string conversion circuitry 220 to and from the memory array 230. In some embodiments, the main memory I/O circuitry 214 can include one or more direct memory access (DMA) components that can transfer the bit strings (e.g., posit bit strings stored as blocks of data) from the bit string conversion circuitry 220 to the memory array 230, and vice versa.

In some embodiments, the main memory I/O circuitry 214 can facilitate transfer of bit strings, data, and/or commands from the memory array 230 to the bit string conversion circuitry 220 so that the bit string conversion circuitry 220 can perform operations on the bit strings. Similarly, the main memory I/O circuitry 214 can facilitate transfer of bit strings that have had one or more operations performed on them by the bit string conversion circuitry 220 to the memory array 230. As described in more detail herein, the operations can include operations to vary a numerical value and/or a quantity of bits of the bit string(s) by, for example, altering a numerical value and/or a quantity of bits of various bit sub-sets associated with the bit string(s). As described above, in some embodiments, the bit string(s) can be formatted as a unum or posit.

The row address strobe (RAS)/column address strobe (CAS) chain control circuitry 216 and the RAS/CAS chain component 218 can be used in conjunction with the memory array 230 to latch a row address and/or a column address to initiate a memory cycle. In some embodiments, the RAS/CAS chain control circuitry 216 and/or the RAS/CAS chain component 218 can resolve row and/or column addresses of the memory array 230 at which read and write operations associated with the memory array 230 are to be initiated or terminated. For example, upon completion of an operation using the bit string conversion circuitry 220, the RAS/CAS chain control circuitry 216 and/or the RAS/CAS chain component 218 can latch and/or resolve a specific location in the memory array 230 to which the bit strings that have been operated upon by the bit string conversion circuitry 220 are to be stored. Similarly, the RAS/CAS chain control circuitry 216 and/or the RAS/CAS chain component 218 can latch and/or resolve a specific location in the memory array 230 from which bit strings are to be transferred to the bit string conversion circuitry 220 prior to the bit string conversion circuitry 220 performing an operation on the bit string(s).

The bit string conversion circuitry 220 can include logic circuitry (e.g., the logic circuitry 122 illustrated in FIG. 1) and/or memory resource(s) (e.g., the memory resource 124 illustrated in FIG. 1). Bit strings (e.g., data, a plurality of bits, etc.) can be received by the bit string conversion circuitry 220 from, for example, the host 202, the memory array 230, and/or an external memory device and stored by the bit string conversion circuitry 220, for example in the memory resource 224 of the bit string conversion circuitry 220. The bit string conversion circuitry (e.g., the logic circuitry 222 of the bit string conversion circuitry 220) can perform operations (or cause operations to be performed) on the bit string(s) to alter a numerical value and/or quantity of bits contained in the bit string(s) to vary the level of precision associated with the bit string(s). As described above, in some embodiments, the bit string(s) can be formatted in a unum or posit format.

As described in more detail in connection with FIGS. 3 and 4A-4B, universal numbers and posits can provide improved accuracy and may require less storage space (e.g., may contain a smaller number of bits) than corresponding bit strings represented in the floating-point format. For example, a numerical value represented by a floating-point number can be represented by a posit with a smaller bit width than that of the corresponding floating-point number. Accordingly, by varying the precision of a posit bit string to tailor the precision of the posit bit string to the application in which it will be used, performance of the memory device 204 may be improved in comparison to approaches that utilize only floating-point bit strings because subsequent operations (e.g., arithmetic and/or logical operations) may be performed more quickly on the posit bit strings (e.g., because the data in the posit format is smaller and therefore requires less time to perform operations on) and because less memory space is required in the memory device 204 to store the bit strings in the posit format, which can free up additional space in the memory device 204 for other bit strings, data, and/or other operations to be performed.

In some embodiments, the bit string conversion circuitry 220 can perform (or cause performance of) arithmetic and/or logical operations on the posit bit strings after the precision of the bit string is varied. For example, the bit string conversion circuitry 220 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. As will be appreciated, the foregoing list of operations is not intended to be exhaustive, nor is the foregoing list of operations intended to be limiting, and the bit string conversion circuitry 220 may be configured to perform (or cause performance of) other arithmetic and/or logical operations on posit bit strings.

In some embodiments, the bit string conversion circuitry 220 may perform the above-listed operations in conjunction with execution of one or more machine learning algorithms. For example, the bit string conversion circuitry 220 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed).

In contrast, by performing such operations using the bit string conversion circuitry 220, for example, by performing such operations on bit strings in the posit format, the amount of processing resources and/or the amount of time consumed in performing the operations may be reduced in comparison to approaches in which such operations are performed using bit strings in a floating-point format. Further, by varying the level of precision of the posit bit strings, operations performed by the bit string conversion circuitry 220 can be tailored to a level of precision desired based on the type of operation the bit string conversion circuitry 220 is performing.

In a non-limiting example, the memory device 204 can receive data comprising a bit string having a first quantity of bits that corresponds to a first level of precision from the host 202. For example, the bit string conversion circuitry 220, which can include logic circuitry (e.g., the logic circuitry 122 illustrated in FIG. 1) and a memory resource (e.g., the memory resource 124 illustrated in FIG. 1) can receive data comprising a bit string having a first quantity of bits that corresponds to a first level of precision from the host 202, the memory array 230, and/or other circuitry external to the memory device 204. In some embodiments, the controller 210 can cause the bit string conversion circuitry 220 to perform an operation to convert vary the precision of the bit string to a second level of precision.

In some embodiments, the controller 210 can be configured to cause the bit string conversion circuitry 220 to perform the operation without encumbering the host 202 (e.g., without receiving an intervening command or a command separate from a command to initiate performance of the operation from the host 202). Embodiments are not so limited, however, and in some embodiments, the controller 210 can be configured to cause the bit string conversion circuitry 220 (e.g., the logic circuitry) to perform the operation to vary the precision of the bit string, or the bit string conversion circuitry 220 can perform the operation to vary the precision of the bit string in response to a determination that a posit bit string is stored by the bit string conversion circuitry 220.

As described above in connection with FIG. 2A, the memory array 230 can be a DRAM array, SRAM array, STT RAM array, PCRAM array, TRAM array, RRAM array, NAND flash array, and/or NOR flash array, for instance, although embodiments are not limited to these particular examples. The memory array 230 can function as main memory for the computing system 200 shown in FIG. 2B. In some embodiments, the memory array 230 can be configured to store bit strings operated on by the bit string conversion circuitry 220 and/or store bit strings to be transferred to the bit string conversion circuitry 220.

FIG. 2C is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the memory device 204, the FPGA 221, the ASIC 223, etc.) can be separately referred to herein as an "apparatus."

As shown in FIG. 2C, the host 202 can be coupled to the memory device 204 via channel(s) 203, which can be analogous to the channel(s) 203 illustrated in FIG. 2A. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

As described above, circuitry located on the memory device 204 (e.g., the bit string conversion circuitry 220 illustrated in FIGS. 2A and 2B) can perform an operation on posit bit strings to alter a numerical value or a quantity of bits associated with various bit sub-sets of the posit bit string to vary the precision of the posit bit string. Embodiments are not so limited, however, and in some embodiments, the operation to alter a numerical value or a quantity of bits associated with various bit sub-sets of the posit bit string to vary the precision of the posit bit string can be performed by the FPGA 221 and/or the ASIC 223. Subsequent to performing the operation to vary the precision of the posit bit string, the bit string(s) can be transferred to the FPGA 221 and/or to the ASIC 223. Upon receipt of the posit bit strings, the FPGA 221 and/or the ASIC 223 can perform arithmetic and/or logical operations on the received posit bit strings.

As described above, non-limiting examples of arithmetic and/or logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 or the memory device 204 and perform an operation to alter a numerical value or a quantity of bits associated with various bit sub-sets of the posit bit string to vary the precision of the posit bit string and/or perform arithmetic and/or logical operations on the posit bit strings to produce resultant posit bit strings that represents a result of the operation performed on the received posit bit strings.

The register(s) 229 of the FPGA 221 can be configured to buffer and/or store the posit bit strings received form the host 202 prior to the state machine 227 performing an operation on the received posit bit strings. In addition, the register(s) 229 of the FPGA 221 can be configured to buffer and/or store a resultant posit bit string that represents a result of the operation performed on the received posit bit strings prior to transferring the result to circuitry external to the FPGA 221, such as the host 202 or the memory device 204, etc.

The ASIC 223 can include logic 241 and/or a cache 243. The logic 241 can include circuitry configured to perform operations on an input and produce an output. In some embodiments, the ASIC 223 is configured to receive posit bit strings from the host 202 and/or the memory device 204 and perform an operation to alter a numerical value or a quantity of bits associated with various bit sub-sets of the posit bit string to vary the precision of the posit bit string and/or perform arithmetic and/or logical operations on the posit bit strings to produce resultant posit bit strings that represents a result of the operation performed on the received posit bit strings.

The cache 243 of the ASIC 223 can be configured to buffer and/or store the posit bit strings received form the host 202 prior to the logic 241 performing an operation on the received posit bit strings. In addition, the cache 243 of the ASIC 223 can be configured to buffer and/or store a resultant posit bit string that represents a result of the operation performed on the received posit bit strings prior to transferring the result to circuitry external to the ASIC 223, such as the host 202 or the memory device 204, etc.

Although the FPGA 221 is shown as including a state machine 227 and register(s) 229, in some embodiments, the FPGA 221 can include logic, such as the logic 241, and/or a cache, such as the cache 243 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 241 and/or the cache 243.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a first bit sub-set or a sign bit sub-set 333), a set of regime bits (e.g., a second bit sub-set or the regime bit sub-set 335), a set of exponent bits (e.g., a third bit sub-set or an exponent bit sub-set 337), and a set of mantissa bits (e.g., a fourth bit sub-set or a mantissa bit sub-set 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 r̄ correspond to an opposite bit that terminates the bit string. For example, for the numerical k value −2 shown in Table 1, the regime bits r correspond to the first two leading zeros, while the regime bit(s) r̄ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of useed$^k$, where useed=$2^{2^{es}}$. Several example values for useed are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f which can be analogous to the fraction 1·f, where f includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0·f).

As described herein, alter a numerical value or a quantity of bits of one of more of the sign 333 bit sub-set, the regime 335 bit sub-set, the exponent 337 bit sub-set, or the mantissa 339 bit sub-set can vary the precision of the n-bit posit 331. For example, changing the total number of bits in the n-bit posit 331 can alter the resolution of the n-bit posit bit string 331. That is, an 8-bit posit can be converted to a 16-bit posit by, for example, increasing the numerical values and/or the quantity of bits associated with one or more of the posit bit string's constituent bit sub-sets to increase the resolution of the posit bit string. Conversely, the resolution of a posit bit string can be decreased for example, from a 64-bit resolution to a 32-bit resolution by decreasing the numerical values and/or the quantity of bits associated with one or more of the posit bit string's constituent bit sub-sets.

In some embodiments, altering the numerical value and/or the quantity of bits associated with one or more of the regime 335 bit sub-set, the exponent 337 bit sub-set, and/or the mantissa 339 bit sub-set to vary the precision of the n-bit posit 331 can lead to an alteration to at least one of the other of the regime 335 bit sub-set, the exponent 337 bit sub-set, and/or the mantissa 339 bit sub-set. For example, when altering the precision of the n-bit posit 331 to increase the resolution of the n-bit posit bit string 331 (e.g., when performing an "up-convert" operation to increase the bit width of the n-bit posit bit string 331), the numerical value and/or the quantity of bits associated with one or more of the regime 335 bit sub-set, the exponent 337 bit sub-set, and/or the mantissa 339 bit sub-set may be altered.

In a non-limiting example in which the resolution of the n-bit posit bit string 331 is increased (e.g., the precision of the n-bit posit bit string 331 is varied to increase the bit width of the n-bit posit bit string 331) but the numerical value or the quantity of bits associated with the exponent 337 bit sub-set does not change, the numerical value or the quantity of bits associated with the mantissa 339 bit sub-set may be increased. In at least one embodiment, increasing the numerical value and/or the quantity of bits of the mantissa 339 bit sub-set when the exponent 337 bit sub-set remains unchanged can include adding one or more zero bits to the mantissa 339 bit sub-set.

In another non-limiting example in which the resolution of the n-bit posit bit string 331 is increased (e.g., the precision of the n-bit posit bit string 331 is varied to increase the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In another example in which the resolution of the n-bit posit bit string 331 is increased (e.g., the precision of the n-bit posit bit string 331 is varied to increase the bit width of the n-bit posit bit string 331), the numerical value and/or the quantity of bits associated with the exponent 337 bit sub-set may be increased and the numerical value and/or the quantity of bits associated with the regime 335 bit sub-set may be decreased. Conversely, in some embodiments, the numerical value and/or the quantity of bits associated with the exponent 337 bit sub-set may be decreased and the numerical value and/or the quantity of bits associated with the regime 335 bit sub-set may be increased.

In a non-limiting example in which the resolution of the n-bit posit bit string 331 is decreased (e.g., the precision of the n-bit posit bit string 331 is varied to decrease the bit width of the n-bit posit bit string 331) but the numerical value or the quantity of bits associated with the exponent 337 bit sub-set does not change, the numerical value or the quantity of bits associated with the mantissa 339 bit sub-set may be decreased. In at least one embodiment, decreasing the numerical value and/or the quantity of bits of the mantissa 339 bit sub-set when the exponent 337 bit sub-set remains unchanged can include truncating the numerical value and/or the quantity of bits associated with the mantissa 339 bit sub-set.

In another non-limiting example in which the resolution of the n-bit posit bit string 331 is decreased (e.g., the precision of the n-bit posit bit string 331 is varied to decrease the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In some embodiments, changing the numerical value and/or a quantity of bits in the exponent bit sub-set can alter the dynamic range of the n-bit posit 331. For example, a 32-bit posit bit string with an exponent bit sub-set having a numerical value of zero (e.g., a 32-bit posit bit string with es=0, or a (32,0) posit bit string) can have a dynamic range of approximately 18 decades. However, a 32-bit posit bit string with an exponent bit sub-set having a numerical value of 3 (e.g., a 32-bit posit bit string with es=3, or a (32,3) posit bit string) can have a dynamic range of approximately 145 decades.

FIG. 4A is an example of positive values for a 3-bit posit. In FIG. 4A, only the right half of projective real numbers, however, it will be appreciated that negative projective real numbers that correspond to their positive counterparts shown in FIG. 4A can exist on a curve representing a transformation about they-axis of the curves shown in FIG. 4A.

In the example of FIG. 4A, es=2, so useed=$2^{2^{es}}$=16. The precision of a posit 431-1 can be increased by appending bits the bit string, as shown in FIG. 4B. For example, appending a bit with a value of one (1) to bit strings of the posit 431-1 increases the accuracy of the posit 431-1 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

If maxpos is the largest positive value of a bit string of the posits 431-1, 431-2, 431-3 and minpos is the smallest value of a bit string of the posits 431-1, 431-2, 431-3, maxpos may be equivalent to useed and minpos may be equivalent to 1/useed. Between maxpos and ±∞, a new bit value may be maxpos*useed, and between zero and minpos, a new bit value may be $$\frac{minpos}{useed}.$$

These new useed bit values can correspond to a new regime bit 335. Between existing values x=$2^m$ and y=$2^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about they-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly useed$^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit (r̄) appended thereto. As described above, between existing values, the corresponding bit strings have an additional exponent bit appended thereto. For example, the numerical values ¹⁄₁₆, ¼, 1, and 4 will have an exponent bit appended thereto. That is, the final one corresponding to the numerical value 4 is an exponent bit, the final zero corresponding o the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between 1/16 and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and f is a value represented by $1. f_1 f_2 \ldots f_{fs}$ (e.g., by a one followed by a decimal point followed by the mantissa bits 339), the p can be given by Equation 1, below.

$$x = \begin{cases} 0, & p = 0 \\ \pm\infty, & p = -2^{n-1} \\ \text{sign}(p) \times useed^k \times 2^e \times f, & \text{all other } p \end{cases} \quad \text{Equation 1}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|---|---|---|---|
| 0 | 0001 | 101 | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is 256-3 (e.g., $useed^k$). The exponent bits 337 represent five (5) as an unsigned integer and therefore contribute an additional scale factor of $2^e=2^5=32$. Lastly, the mantissa bits 339, which are given in Table 3 as 11011101, represent two-hundred and twenty-one (221) as an unsigned integer, so the mantissa bits 339, given above as f are $$f + \frac{221}{256}.$$

Using these values and Equation 1, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
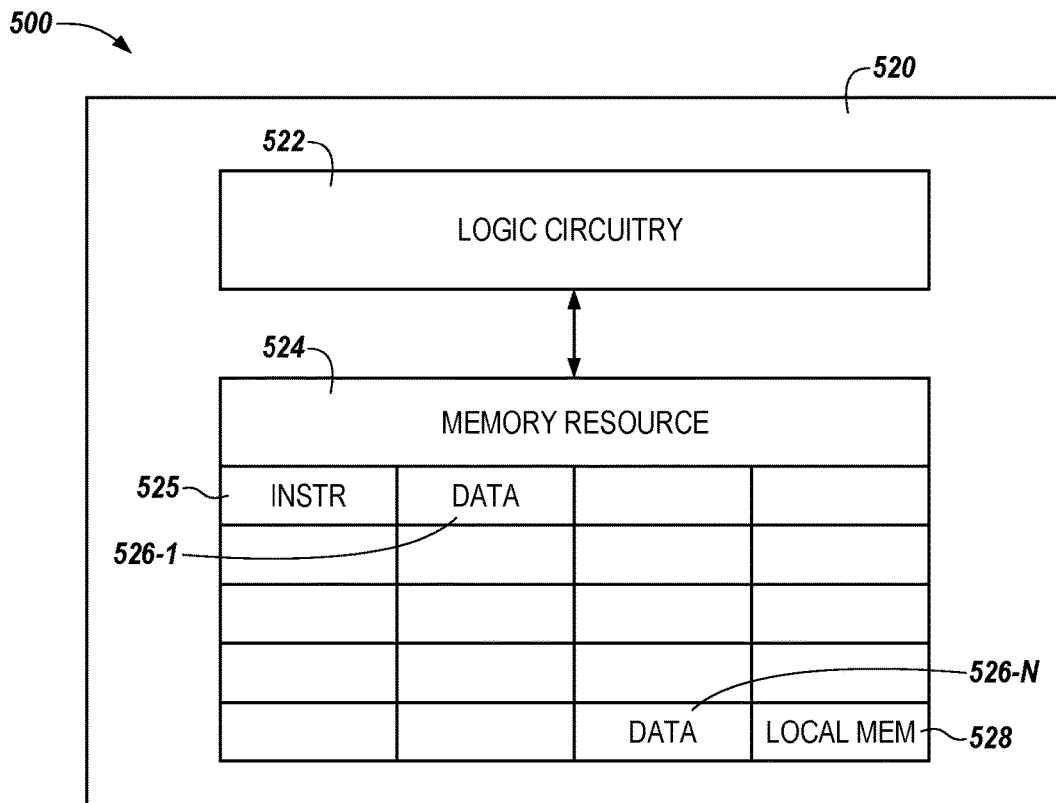
FIG. 5 is a functional block diagram in the form of acceleration circuitry in accordance with a number of embodiments of the present disclosure.

FIG. 5 is a functional block diagram in the form of an apparatus 500 including bit string conversion circuitry 520 in accordance with a number of embodiments of the present disclosure. The bit string conversion circuitry 520 can include logic circuitry 522 and a memory resource 524, which can be analogous to the logic circuitry 122 and the memory resource 124 illustrated in FIG. 1, herein. The logic circuitry 522 and/or the memory resource 524 can separately be considered an "apparatus."

The bit string conversion circuitry 520 can be configured to receive a command (e.g., an initiation command) from a host (e.g., the host 102/202 illustrated in FIGS. 1 and 2, herein) and/or a controller (e.g., the controller 210 illustrated in FIG. 2, herein) to initiate performance of one or more operations (e.g., operations to alter a numerical value or a quantity of bits associated with various bit sub-sets of the posit bit string to vary the precision of the posit bit string, etc.) on data stored in the memory resource 524. Once the initiation command has been received by the bit string conversion circuitry 520, the bit string conversion circuitry 520 can perform the operations described above in the absence of intervening commands from the host and/or the controller. For example, the bit string conversion circuitry 520 can include sufficient processing resources and/or instructions to perform operations on the bit strings stored in the memory resource 524 without receiving additional commands from circuitry external to the bit string conversion circuitry 520.

The logic circuitry 522 can be an arithmetic logic unit (ALU), a state machine, sequencer, controller, an instruction set architecture, or other type of control circuitry. As described above, an ALU can include circuitry to perform operations (e.g., operations to alter a numerical value or a quantity of bits associated with various bit sub-sets of the posit bit string to vary the precision of the posit bit string, etc.) such as the operations described above, on integer binary numbers, such as bit strings in the posit format. An instruction set architecture (ISA) can include a reduced instruction set computing (RISC) device. In embodiments in which the logic circuitry 522 includes a RISC device, the RISC device can include a processing resource or processing unit that can employ an instruction set architecture (ISA) such as a RISC-V ISA, however, embodiments are not limited to RISC-V ISAs and other processing devices and/or ISAs can be used.

In some embodiments, the logic circuitry 522 can be configured to execute instructions (e.g., instructions stored in the INSTR 525 portion of the memory resource 524) to perform the operations herein. For example, the logic circuitry 522 is provisioned with sufficient processing resources to cause performance of such operations on the data (e.g., on bit strings) received by the bit string conversion circuitry 520.

Once the operation(s) are performed by the logic circuitry 522, the resultant bit strings can be stored in the memory resource 524 and/or a memory array (e.g., the memory array 230 illustrated in FIG. 2, herein). The stored resultant bit strings can be addressed such that it is accessible for performance of the operations. For example, the bit strings can be stored in the memory resource 524 and/or the memory array at particular physical addresses (which may have corresponding logical addresses corresponding thereto) such that the bit strings can be accessed in performing the operations.

The memory resource 524 can, in some embodiments, be a memory resource such as random-access memory (e.g., RAM, SRAM, etc.). Embodiments are not so limited, however, and the memory resource 524 can include various registers, caches, buffers, and/or memory arrays (e.g., 1T1C, 2T2C, 3T, etc. DRAM arrays). The memory resource 524 can be configured to receive a bit string(s) from, for example, a host such as the host 202 illustrated in FIGS. 2A-2C and/or a memory array such as the memory array 230 illustrated in FIGS. 2A and 2B, herein. In some embodiments, the memory resource 524 can have a size of approximately 256 kilobytes (KB), however, embodiments are not limited to this particular size, and the memory resource 524 can have a size greater than, or less than, 256 KB.

The memory resource 524 can be partitioned into one or more addressable memory regions. As shown in FIG. 5, the memory resource 524 can be partitioned into addressable memory regions so that various types of data can be stored therein. For example, one or more memory regions can store instructions ("INSTR") 525 used by the memory resource 524, one or more memory regions can store data 526-1, . . . , 526-N (e.g., data such as a bit string retrieved from the host and/or the memory array), and/or one or more memory regions can serve as a local memory ("LOCAL MEM.") 528 portion of the memory resource 524. Although 20 distinct memory regions are shown in FIG. 5, it will be appreciated that the memory resource 524 can be partitioned into any number of distinct memory regions.

As discussed above, the bit string(s) can be retrieved from the host and/or memory array in response to messages and/or commands generated by the host, a controller (e.g., the controller 210 illustrated in FIG. 2, herein), or the logic circuitry 522. In some embodiments, the commands and/or messages can be processed by the logic circuitry 522. Once the bit string(s) are received by the bit string conversion circuitry 520 and stored in the memory resource 524, they can be processed by the logic circuitry 522. Processing the bit string(s) by the logic circuitry 522 can include altering a numerical value or a quantity of bits associated with various bit sub-sets of the posit bit string to vary the precision of the posit bit string.

In a non-limiting neural network training application, the bit string conversion circuitry 520 can convert a 16-bit posit with es=0 into an 8-bit posit with es=0 for use in a neural network training application. In some approaches, a half-precision 16-bit floating-point bit string can be used for neural network training, however, in contrast to some approaches that utilize a half-precision 16-bit floating-point bit string for neural network training, an 8-bit posit bit string with es=0 can provide comparable neural network training results two to four times faster than the half-precision 16-bit floating-point bit string.

For example, if the bit string conversion circuitry 520 receives a 16-bit posit bit string with es=0 for use in a neural network training application, the bit string conversion circuitry 520 can selectively remove bits from one or more bit sub-sets of the 16-bit posit bit string to vary the precision of the 16-bit posit bit string to an 8-bit posit bit string with es=0. It will be appreciated that embodiments are not so limited, and the bit string conversion circuitry can vary the precision of the bit string to produce an 8-bit posit bit string with es=1 (or some other value). In addition, the bit string conversion circuitry 520 can vary the precision of the 16-bit posit bit string to yield a 32-bit posit bit string (or some other value).

A common function used in training neural networks is a sigmoid function $f(x)$ (e.g., a function that asymptotically approaches zero as $x \to -\infty$ and asymptotically approaches 1 as $x \to \infty$). An example of a sigmoid function that may be used in neural network training applications is $$\frac{1}{1+e^{-x}},$$

which can require upwards of one-hundred clock cycles to compute using half-precision 16-bit floating-point bit strings. However, using an 8-bit posit with es=0, the same function can be evaluated by flipping the first bit of the posit representing x and shifting two bits to the right—operations that may take at least an order of magnitude fewer clock signals in comparison to evaluation of the same function using a half-precision 16-bit floating-point bit string.

In this example, by operating the bit string conversion circuitry 520 to vary the precision of the posit bit string to yield a more desirable level of precision, processing time, resource consumption, and/or storage space can be reduced in comparison to approaches that do not include bit string conversion circuitry 520 configured to perform such conversion and/or subsequent operations. This reduction in processing time, resource consumption, and/or storage space can improve the function of a computing device in which the bit string conversion circuitry 520 is operating by reducing the number of clock signals used in performing such operations, which may reduce an amount of power consumed by the computing device and/or an amount of time to perform such operations, as well as by freeing up processing and/or memory resources for other tasks and functions.

Figure 6:
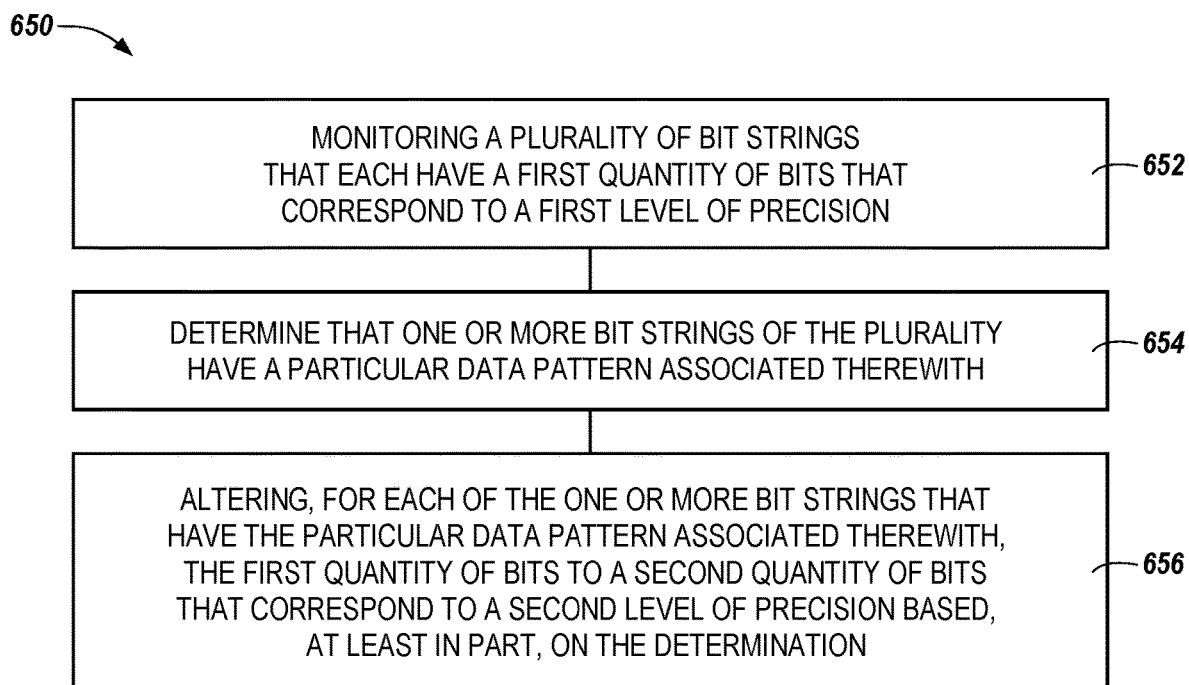
FIG. 6 is a flow diagram representing an example method for bit string conversion in accordance with a number of embodiments of the present disclosure.

FIG. 6 is a flow diagram representing an example method 650 for arithmetic logic circuitry in accordance with a number of embodiments of the present disclosure. At block 652, the method 650 can include monitoring a plurality of bit strings that each have a first quantity of bits that correspond to a first level of precision. In some embodiments, each bit string of the plurality comprises a sign bit sub-set, a regime bit sub-set, an exponent bit sub-set, and a mantissa bit sub-set.

At block 654, the method 650 can include determine that one or more bit strings of the plurality have a particular data pattern associated therewith. In some embodiments, the method 650 can include determining that at least one bit sub-set of the one or more bit strings that have the first quantity of bits has a threshold quantity of bits having a particular value as part of determining that the bit string has the particular data pattern.

At block 656, the method 650 can include altering, for each of the one or more bit strings that have the particular data pattern associated therewith, the first quantity of bits to a second quantity of bits that correspond to a second level of precision based, at least in part, on the determination. The first level of precision and/or the second level of precision can correspond to a dynamic range of the bit string or a resolution of the bit string, among others. In some embodiments, the bit string can include a mantissa, a base, and an exponent, and wherein the other of the first format or the second format includes a mantissa, a regime, a sign, and an exponent. For example, the first sub-set of bits indicates a sign corresponding to the first bit string and the second bit string, the second sub-set of bits indicates a regime corresponding to the first bit string and the second bit string, the third sub-set of bits indicates an exponent corresponding to the first bit string and the second bit string, and the fourth sub-set of bits indicates a mantissa corresponding to the first bit string and the second bit string. Stated alternatively, the bit string can be in a universal number format, such as a posit format. In some embodiments, the method 650 can include altering at least one bit of the sign bit sub-set, the regime bit sub-set, the exponent bit sub-set, and the mantissa bit sub-set for each of the one or more bit strings.

The method 650 can include performing, by the logic circuitry, the operation to alter the first quantity of bits of the first bit string to generate a second bit string having a second quantity of bits that correspond to a second level of precision and/or a subsequent operation on the bit string in the absence of an intervening command from the host. That is, as described in connection with FIGS. 1, 2, and 5, herein, the logic circuitry can be robust enough to perform the operation on the bit string and/or a subsequent operation on the bit string without encumbering (e.g., without receiving intervening commands from) circuitry (e.g., a host or other circuitry) external to the logic circuitry.

The method 650 can include increasing a quantity of bits associated with the first bit sub-set, the second bit sub-set, the third bit sub-set, and the fourth bit sub-set and decreasing the quantity of bits associated with a different one of the first bit sub-set, the second bit sub-set, the third bit sub-set, and the fourth bit sub-set. For example, the method can include increasing a numerical value or a quantity of bits associated with at least one of a sign bit sub-set (e.g., the first bit sub-set), a regime bit sub-set (e.g., the second bit sub-set), an exponent bit sub-set (e.g., the third bit sub-set), and/or a mantissa bit sub-set (e.g., the fourth bit sub-set) of the bit string. In addition, the method 650 can include a decreasing numerical value or a quantity of bits associated with at least one of a sign bit sub-set (e.g., the first bit sub-set), a regime bit sub-set (e.g., the second bit sub-set), an exponent bit sub-set (e.g., the third bit sub-set), and/or a mantissa bit sub-set (e.g., the fourth bit sub-set) of the bit string.

In some embodiments, the method 650 can include determining that a quantity of bits corresponding to the exponent are unchanged and increasing or decreasing a quantity of bits corresponding to the mantissa in response to the determination. For example, the method 650 can include determining that the numerical value or a quantity of bits associated with the exponent bit sub-set are not changed during performance of the operation to alter the numerical value or the quantity of bits of the first bit sub-set, the second bit sub-set, the third bit sub-set, and the fourth bit sub-set and increasing or decreasing the numerical value or the quantity of bits associated with the mantissa bit sub-set of the bit string.

The method 650 can further include increasing or decreasing a quantity of bits corresponding to the exponent and increasing or decreasing the quantity of bits of the regime and the mantissa in response to increasing or decreasing the quantity of bits of the exponent. For example, the method 650 can include determining that the numerical value or a quantity of bits associated with the exponent bit sub-set are increased or decreased during performance of the operation to alter the numerical value or the quantity of bits of the first bit sub-set, the second bit sub-set, the third bit sub-set, and the fourth bit sub-set and increasing or decreasing the numerical value or the quantity of bits associated with the mantissa bit sub-set and the regime bit sub-set of the bit string.

In some embodiments, the method 650 can include increasing a quantity of bits corresponding to the exponent or the regime and decreasing the quantity of bits of the other of the exponent or the regime. For example, the method 650 can include increasing a numerical value or a quantity of bits associated with the exponent bit sub-set and decreasing a numerical value or a quantity of bits associated with the regime bit sub-set. Conversely, in some embodiments, the method 650 can include decreasing a numerical value or a quantity of bits associated with the exponent bit sub-set and increasing a numerical value or a quantity of bits associated with the regime bit sub-set.

The method 650 can further include altering a numerical value corresponding to the exponent without increasing or decreasing the quantity of bits of the sign, the regime, or the mantissa. For example, the method 650 can include altering the numerical value of the exponent bit sub-set without altering a total bit width of the bit string. In a non-limiting example where the bit string has a bit width of 32-bits and an exponent bit sub-set value of one (e.g., a bit string represented as (32,1), where the 32 corresponds to the bit width of the bit string and the one corresponds to the numerical value or quantity of exponent bits included in the exponent bit sub-set), the method 650 can include altering the numerical value of the exponent bit sub-set to, for example, a bit string that is represented as a (32,21), (32,3), etc. bit string.

The method 650 can include determining a maximum positive (e.g., maxpos described in connection with FIGS. 4A and 4B) value for the second bit string and/or determining a minimum positive (e.g., minpos described in connection with FIGS. 4A and 4B) value for the second bit string. The method 650 can further include performing, by, for example, the logic circuitry, an operation to set the second quantity of bits of the second bit string to the maximum positive value for the second bit string or the minimum positive value for the second bit string. For example, it may be necessary to clip the bit width of the second bit string to the minimum positive value associated with the bit string to avoid converting a bit string with a small numerical value or a small number of bits to zero. Similarly, it may be necessary to cap the bit width of the resultant bit string at the maximum positive value associated with the bit string to avoid a scenario in which the bit width of the bit string becomes too large.

In some embodiments, the method 650 can include receiving a subsequent bit string that has the first quantity of bits that correspond to the first level of precision, determining that the subsequent bit string plurality has the particular data pattern associated therewith, and altering, for the subsequent bit string, the first quantity of bits to a second quantity of bits that correspond to a second level of precision based, at least in part, on the determination that the subsequent bit string plurality has the particular data pattern associated therewith. For example, a machine learning component such as the machine learning component 109 illustrated in FIG. 1B can be trained to alter the level of precision for subsequent bit strings based on the behavior of previous bit strings.

The method 650 can further include incrementing a counter in response to determining that each of the one or more bit strings has the particular data pattern associated therewith, determining that the counter has been incremented to a threshold value, determining that a subsequent bit string has the first quantity of bits that correspond to the first level of precision, and/or altering, for the subsequent bit string, the first quantity of bits to the second quantity of bits that correspond to a second level of precision based, at least in part, on the determination that the counter has been incremented to the threshold value. The counter can be analogous to the counter 109 illustrated in FIG. 1B, herein.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
monitoring a bit string that has a first total quantity of bits that correspond to a first level of precision to determine whether one or more bit sub-sets of the bit string have a threshold quantity of bits having a particular value;
determining that the bit string has a particular data pattern associated therewith based on determining that the one or more bit sub-sets of the bit string have the threshold quantity of bits having the particular value; and
altering the first total quantity of bits to a second total quantity of bits that correspond to a second level of precision based, at least in part, on the determination that the bit string has the particular data pattern associated therewith; and
incrementing a counter based, at least in part, on alteration of the first total quantity of bits of the particular bit string to the second total quantity of bits responsive to the determination that the particular bit string has the particular data pattern associated therewith.

2. The method of claim 1, further comprising:
determining that altering the first total quantity of bits to the second total quantity of bits will cause a numerical value of the bit string to have a value less than zero; and
taking an action to prevent the second total quantity of bits from having the value less than zero.

3. The method of claim 1, further comprising altering the first total quantity of bits to the second total quantity of bits in absence of a user generated command.

4. The method of claim 1, wherein the bit sub-sets comprise a sign bit sub-set, a regime bit sub-set, an exponent bit sub-set, and a mantissa bit sub-set, and
wherein the method further comprises altering the first total quantity of bits to the second quantity of bits comprises altering a numerical value corresponding to one of the sign bit sub-set, the regime bit sub-set, the exponent bit sub-set, or the mantissa bit sub-set without altering a quantity of bits associated with at least one different one of the sign bit sub-set, the regime bit sub-set, the exponent bit sub-set, or the mantissa bit sub-set.

5. The method of claim 1, further comprising altering first total quantity of bits to the second total quantity of bits based, at least in part, on characteristics of an application in which the bit string is invoked.

6. The method of claim 1, further comprising:
determining an amount of power allocated for performance of an application in which the bit string is invoked; and
altering the first total quantity of bits to the second total quantity of bits that correspond to the second level of precision based, at least in part, on the amount of power allocated for performance of the application in which the bit string is invoked.

7. An apparatus, comprising:
a memory device;
a counter resident on the memory device, the counter to be incremented based, at least in part on a determination that a particular bit string has a particular data pattern associated therewith; and
a machine learning component resident on the memory device, wherein the machine learning component comprises circuitry to:
monitor a particular bit string that has a first quantity of bits that correspond to a first level of precision;
determine that one or more bit sub-sets of the bit string have a threshold quantity of bits having a particular value;
determine that the particular bit string has a particular data pattern associated therewith based on the determination that the one or more bit sub-sets of the bit string have the threshold quantity of bits having the particular value;
alter the first quantity of bits of the particular bit string to a second quantity of bits that correspond to a second level of precision based, at least in part, on the determination that the particular bit string has the particular data pattern associated therewith; and
increment the counter based, at least in part, on alteration of the first total quantity of bits of the particular bit string to the second total quantity of bits responsive to the determination that the particular bit string has the particular data pattern associated therewith.

8. The apparatus of claim 7, wherein the machine learning component is to, responsive to a determination that the first quantity of bits or the second quantity of bits, or both, will have a value less than zero, take an action to prevent the first quantity of bits or the second quantity of bits, or both from having the value below zero.

9. The apparatus of claim 7, wherein the machine learning component is to alter the first quantity of bits to the second quantity of bit in absence of receipt of signaling generated external to the machine learning component.

10. The apparatus of claim 7, wherein the bit string is formatted according to a Type III universal number format or a posit format.

11. The apparatus of claim 7, wherein the machine learning component is to cause one or more bits to be added to, or removed from, at least one bit sub-set of the bit string to alter the first quantity of bits to the second quantity of bits based, at least in part, on the determination that the bit string has the particular data pattern associated therewith.

12. The apparatus of claim 7, wherein the bit sub-sets comprise a sign bit sub-set, a regime bit sub-set, an exponent bit sub-set, and a mantissa bit sub-set, and wherein
the machine learning component is to alter a numerical value corresponding to one of the sign bit sub-set, the regime bit sub-set, the exponent bit sub-set, or the mantissa bit sub-set without increasing or decreasing a quantity of bits associated with at least one different one of the sign bit sub-set, the regime bit sub-set, the exponent bit sub-set, or the mantissa bit sub-set.

13. The apparatus of claim 7, wherein the machine learning component is to:
  determine that an application involving the bit string is to be performed in a power saving mode of a host computing device coupled to the machine learning component; and
  alter the first quantity of bits to the second quantity of bits such that the second quantity of bits is less than the first quantity of bits based, at least in part, on the determination that the application is performed in the power saving mode of the host computing device.

14. The apparatus of claim 7, wherein the machine learning component is to:
  determine that an application involving the bit string is a machine learning application; and
  alter the first quantity of bits to the second quantity of bits such that the second quantity of bits is less than the first quantity of bits based, at least in part, on the determination that the application is the machine learning application.

15. A system, comprising:
  logic circuitry;
  a memory resource coupled to the logic circuitry, the memory resource to receive one or more bit strings each comprising respective bit sub-sets corresponding to a sign portion, a regime portion, an exponent portion, and a mantissa portion and having a first total quantity of bits that correspond to a first level of precision;
  a counter coupled to the logic circuitry and the memory resource, the counter to be incremented based, at least in part on a determination that a particular bit string has a particular data pattern associated therewith; and
  a machine learning component coupled to the counter, the logic circuitry, and the memory resource, wherein the machine learning component is to:
    determine that the respective bit sub-sets of the particular bit string has a threshold total quantity of bits having a particular value;
    determine that the particular bit string has the particular data pattern associated therewith based on the determination that the respective bit sub-sets of the particular bit string has the threshold total quantity of bits having the particular value;
    alter the first total quantity of bits of the particular bit string to a second total quantity of bits that correspond to a second level of precision based, at least in part, on the determination that the particular bit string has the particular data pattern associated therewith; and
    increment the counter based, at least in part, on alteration of the first total quantity of bits of the particular bit string to the second total quantity of bits responsive to the determination that the particular bit string has the particular data pattern associated therewith.

16. The system of claim 15, wherein the machine learning component is to:
  determine that greater than a threshold total quantity of bits associated with the bit string have a value of zero; and
  cause the counter to be incremented based, at least in part on the determination that greater than the threshold total quantity of bits associated with the bit string have the value of zero.

17. The system of claim 15, wherein the machine learning component is to, in absence of signaling received from circuitry external to the machine learning component:
  determine a maximum positive value for the bit string having the second total quantity of bits;
  determine a minimum positive value for the bit string having the second total quantity of bits; and
  alter the second total quantity of bits to a third quantity of bits that correspond to the maximum positive value for the bit string or the minimum positive value for the bit string having the second total quantity of bits.

18. The system of claim 15, further comprising a host computing device coupled to the machine learning component, the counter, the logic circuitry, and the memory resource, wherein the machine learning component is to:
  determine that an application involving the particular bit string is to be performed in a power saving mode of the host computing device; and
  cause the first total quantity of bits to be altered to the second total quantity of bits such that the second total quantity of bits is less than the first total quantity of bits based, at least in part, on the determination that the application is performed in a power saving mode of the host computing device.

19. The system of claim 15, wherein the machine learning component is to:
  determine that an application involving the particular bit string is a machine learning application; and
  alter the first total quantity of bits to a second total quantity of bits such that the second total quantity of bits is less than the first total quantity of bits based, at least in part, on the determination that the application is the machine learning application.

20. The system of claim 15, wherein the one or more bit strings are formatted according to a Type III universal number format or a posit format.

* * * * *